(12) United States Patent
Wille

(10) Patent No.: US 6,334,206 B1
(45) Date of Patent: *Dec. 25, 2001

(54) FORGERY PREVENTION MICROCONTROLLER CIRCUIT

(75) Inventor: Thomas Wille, Hamburg (DE)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,778

(22) Filed: Mar. 10, 1999

(30) Foreign Application Priority Data

Mar. 12, 1998 (DE) .............................. 198 10 730

(51) Int. Cl.⁷ .................................................. G06F 15/70
(52) U.S. Cl. ........................................................ 716/8
(58) Field of Search .............................. 716/8, 9, 10, 11, 716/13, 14; 710/100, 56; 705/54

(56) References Cited

U.S. PATENT DOCUMENTS

| | | | |
|---|---|---|---|
| 3,862,501 | * | 1/1975 | Jemseby et al. ................. 380/54 |
| 3,914,877 | * | 10/1975 | Hines ................................ 380/54 |
| 5,432,925 | * | 7/1995 | Abraham et al. ................ 709/316 |
| 5,577,213 | * | 11/1996 | Avery et al. ..................... 710/100 |
| 5,581,669 | * | 12/1996 | Voth ................................ 358/1.14 |
| 5,771,348 | * | 6/1998 | Kubatzki et al. ................ 713/200 |
| 5,872,998 | * | 2/1999 | Chee ................................. 710/56 |
| 5,946,469 | * | 8/1999 | Chidester .......................... 703/24 |
| 5,982,891 | * | 11/1999 | Ginter et al. .................... 705/54 |

FOREIGN PATENT DOCUMENTS

0378306A2   7/1990   (EP) .............................. H01L/23/58

* cited by examiner

*Primary Examiner*—Caridad Everhart
*Assistant Examiner*—Vuthe Siek
(74) *Attorney, Agent, or Firm*—Daniel J. Piotrowski

(57) ABSTRACT

The invention relates to a microcontroller circuit, comprising circuit elements arranged on a semiconductor body. In order to make a tentative forgery of such a microcontroller circuit at least more difficult, at least a number of the co-operating circuit elements is provided on the semiconductor body in an irregularly scrambled spatial configuration.

12 Claims, 1 Drawing Sheet

FORGERY PREVENTION MICROCONTROLLER CIRCUIT

The invention relates to a microcontroller circuit comprising circuit elements arranged on a semiconductor body.

The reliability of microcontroller circuits, notably for identification systems such as bank credit cards, security systems and the like, is becoming increasingly more important. For example, cash is being replaced more and more by bank credit cards. In respect of use such credit cards should have properties comparable to those of cash. This has a direct effect on the requirements imposed as regards the protection against decryption and forgery of such cards and the microcontroller circuits used thereon.

Because of their construction and their field of application, microcontroller circuits have the property that they can be copied as often as desired and that they can offer functions or data an unlimited number of times. Exactly these properties are in contradiction with the basic property of cash. Therefore, special steps are required so as to enable the use of microcontroller circuits in bank credit cards as a substitute for cash or as a tool for cash-like transactions, without failing to meet the required security level.

There are essentially two categories of attempted forgery of a microcontroller circuit used in a credit card. The first category concerns attempts aimed at the data connection and the data exchange between the microcontroller and the environment, i.e. apparatus in operative contact with the credit card. This category of forgery is counteracted by data encryption methods to ensure the confidentiality and authenticity of the data exchanged.

A second category of attempted forgery of microcontroller circuits in credit cards concerns the attempted decryption and manipulation of the data stored in the microcontroller circuit, for example money units. These attempts may be very diverse. The course of action is dependent on physical and topographic properties of the microcontroller circuit used.

Microcontroller circuits for the described applications nowadays are constructed so as to have an as modular as possible topographic configuration. The topography of the circuit elements of individual function blocks is conceived such that perfect operation is achieved with a minimum use of surface area on the semiconductor body. The overall microcontroller circuit is formed in a modular fashion from function blocks thus developed for different functions. This facilitates and accelerates the development of such microcontroller circuits, but it also facilitates the recognizability and discovery of the assignment of the circuit elements and function blocks to the individual functions to be executed by the microcontroller circuit or to the data stored therein.

Therefore, it may occur that during forgery it is attempted to discover the individual functions of the microcontroller circuit by optical analysis (using a microscope) of the topography. The difficulty then is the least in the case of regular, typical structures in the topography. For example, on the basis of the knowledge of the fact that a microcontroller circuit utilizes a data bus having a word width of 8 bits it may be possible to identify a regular pattern of conductors with eight parallel conductors as a data bus. Such identification makes it easier to monitor or manipulate data on such a data bus.

It is an object of the invention to provide a microcontroller circuit of the kind set forth in which attempted forgery as described above is made at least substantially more difficult.

In a microcontroller circuit of the kind set forth this object is achieved according to the invention by means of an irregularly scrambled spatial configuration of at least a number of co-operating circuit elements on the semiconductor body. Such a configuration makes the regularity of modular structures and function blocks of such a microcontroller circuit irrecognizable to such an extent that analysis of and assignment of the individual circuit elements to given functions or data of the microcontroller require a significantly increased amount of equipment and time. This not only substantially reduces the probability of success of such an analysis, but the cost of such attempted forgery is increased disproportionally in comparison with the benefits to be derived, so that the threshold against forgery is significantly raised. The irregular configuration on the microcontroller circuit may concern the shape and appearance of the individual circuit elements. However, preferably the positions of at least a number of co-operating circuit elements on the semiconductor body and/or the location and routing of the connection leads connected thereto are irregularly scrambled. Use can be made of the fact that circuit elements which are intended for different functions within the microcontroller circuit in most cases have an at least substantially similar construction. This occurs already in the sense of a simple, reliable construction, i.e. in the sense of a modular construction in conventional microcontroller circuits. Therefore, for at least some of the circuit elements of the microcontroller the assignment of a circuit element to a given function of the microcontroller can be determined only by the position of the circuit element on the semiconductor body and, if desired or additionally, by the location and routing of connection leads connected to the relevant circuit element. For example, when irregular scrambling is then performed, resulting in the elimination of regular, modular structures on the semiconductor body, it is no longer possible to discover the function of the circuit elements on the basis of these structures alone. Circuit elements which neighbor one another in the topography of the microcontroller circuit now no longer exhibit the operational coherence known from regular, modular topographies. For example, the individual elements of a shift register chain which spatially adjoin one another in the conventional modular construction can be arranged in positions which are irregularly distributed across the surface of the semiconductor body, or the topography of the shift register structure can be blurred by irregularly routing the connection leads.

If only the location and routing of the connection leads are scrambled in the topography of the microcontroller circuit on a semiconductor body, but the positions of the individual circuit elements are left the same whereas their function within the microcontroller circuit is at least partly scrambled in conformity with the scrambling of the connection leads, only comparatively few additional manufacturing steps or devices will be required so as to manufacture microcontroller circuits having the same function but a completely different appearance. In that case it is in principle only necessary to modify wiring masks for the different topographies, whereas the diffusion masks may remain the same.

Further scrambling and hence camouflaging of the topography can be achieved by assigning given circuit elements their function within the microcontroller circuit only by data which can be variably stored in given other circuit elements of the microcontroller circuit. This enables further scrambling yet even in the case of identical external topography.

In a further embodiment of the microcontroller circuit according to the invention, comprising a central processor unit, at least a number of the circuit elements included in the central processor unit is irregularly scrambled in respect of position and/or location and routing of connection leads connected thereto. This is in contrast with circuit elements included in storage units in the microcontroller circuit for which preferably only the location and routing of connection leads are irregularly scrambled, i.e. at least for a number of the circuit elements of said storage units. This embodiment of the invention takes into account the fact that realizing an irregular construction of storage elements is very difficult from a technical point of view. With a view to achieving an acceptable cost of manufacture of the microcontroller circuit according to the invention, therefore, it is advantageous to maintain regular topographies for the storage units. However, data and address leads can be arranged so as to be irregularly scrambled, notably by interchanging the location and/or routing of at least some of these leads connected to at least a number of the circuit elements included in the storage units. A spatially irregular configuration of the address and/or data leads may be pursued as well as a spatially regular configuration in which, however, the functions of the individual connection leads have been scrambled in comparison with the normally used configurations, so that function of a connection lead as an address and/or data lead cannot be deduced from its location and routing. In a further embodiment of the invention address leads can be irregularly interchanged with data leads, for example, address leads being routed in the same way as data leads in conventional topographies and vice versa. Even though in this interchanged configuration irregular interchanging is most effective for the blurring of the structures and hence for the protection against forgery, a regular, for example cyclical interchanging of leads can also impede the analysis of such a configuration.

In a further embodiment of the microcontroller circuit according to the invention, comprising at least one storage unit and one central processor unit as well as at least one interface circuit interconnecting the former, the interface circuit or circuits is (are) subdivided into interface sub-circuits which occupy separate positions on the semiconductor body. This subdivision is preferably performed irregularly in such a manner that an interface sub-circuit is provided for different data or address signals which are not coherent in respect of function and/or effect. Such an interface sub-circuit may be used, for example for a random selection of data and/or address bits. The interface sub-circuits may also be arranged in different positions which are irregularly distributed across the semiconductor body. In a further embodiment of the invention, they are connected to the storage unit, or the storage units, and the central processor unit preferably by way of connection leads which are connected and routed in an irregularly scrambled manner. Connection leads between individual interface sub-circuits are preferably also connected and/or routed in an irregularly scrambled manner. A configuration which can be recognized in space as a data bus with a plurality of parallel connection leads can thus be avoided. However, if a spatial bus structure is formed by the routing of the connection leads, the signals are preferably distributed between these connection leads in an irregularly scrambled manner in respect of function or significance, so that such a "bus" transports only signals which appear to be incoherent to the environment and whose monitoring or manipulation does not produce a result that can be used for the attempted forgery.

The drawing shows an embodiment of the invention which will be described in detail hereinafter. Therein:

Figure 1:
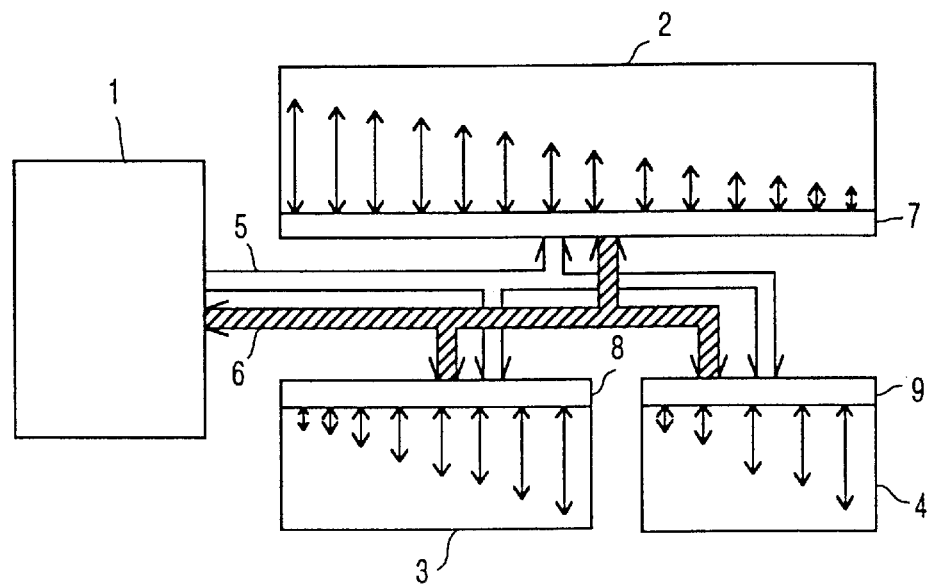
FIG. 1 shows a block diagram of a conventional microcontroller circuit.

FIG. 1 is a coarse diagrammatic representation of a conventional microcontroller circuit which includes a central processor unit 1 as well as three storage units, the first of which is denoted by the reference 2 and is constructed as an EPROM, whereas a second storage unit is denoted by the reference 3 and is constructed as a RAM and a third storage unit is denoted by the reference 4 and is constructed as a ROM. Such assemblies of microcontroller circuits are generally known and need not be elaborated upon in the context of the present invention. The central processor unit 1 is connected to the storage units 2, 3, 4 both via an address bus 5 for delivering address signals to the storage units 2, 3, 4 and via a data bus 6 for the exchange of data signals.

Each of the storage units 2, 3, 4 is provided with an interface circuit 7, 8, 9, respectively. Via the interface circuits 7, 8, 9, the address bus and the data bus 6 are connected, by way of connection leads arranged in a similar structure, to the individual circuit elements of the storage units 2, 3, 4, these circuit elements serve for the storage of data signals individually or in regularly structured groups. The regular configuration of the connection leads within the storage units 2, 3, 4 is symbolized by a series of arrows of uniformly increasing or decreasing length.

Such a microcontroller circuit assembled on a semiconductor body also represents a comparatively clear configuration from a physical point of view, so that it can be comparatively easily analyzed. This favors an attempted forgery.

Figure 2:
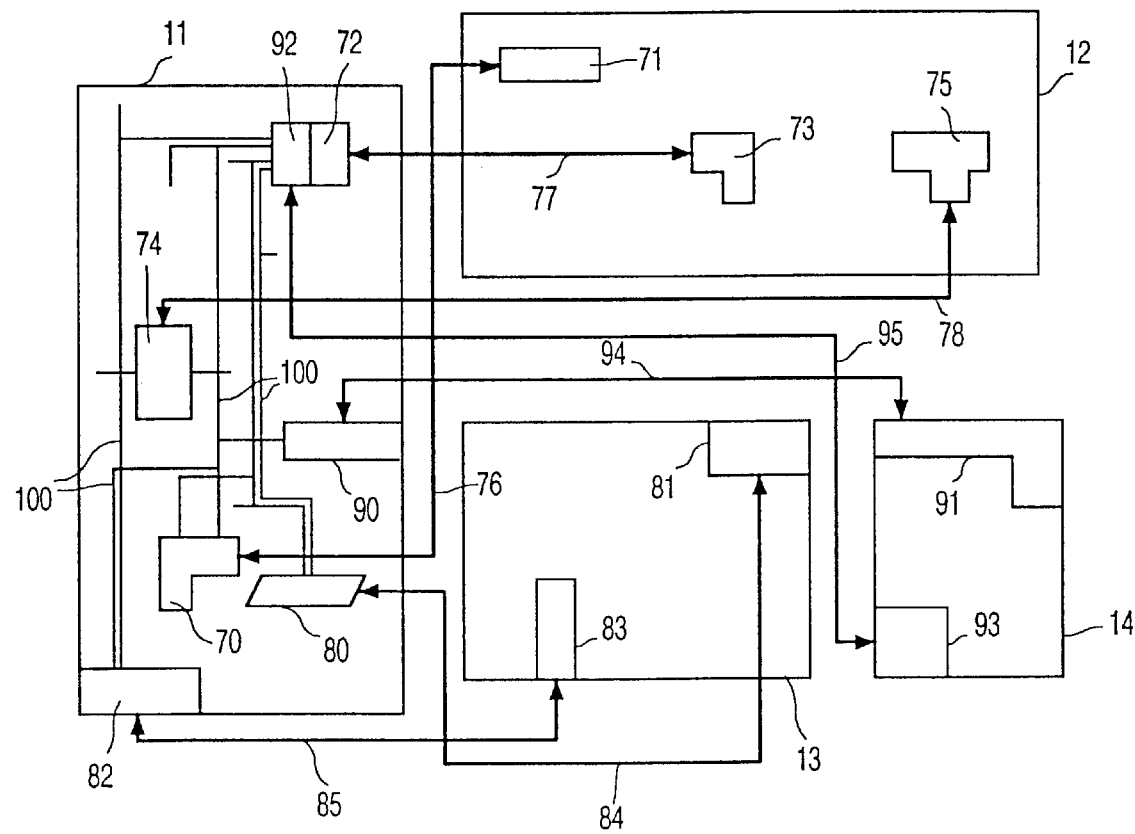
FIG. 2 shows a microcontroller circuit according to the invention.

FIG. 2 shows an embodiment of a microcontroller circuit according to the invention. This circuit again includes a central processor unit 11 as well as three storage units, again constructed as an EEPROM 12, a RAM 13 and a ROM 14. In the microcontroller circuit according to the invention, however, the regular structures in the configuration of the circuit elements within the central processor unit 11 and the storage units 12, 13, 14 as well as notably the regular structures of the connection leads between these units have been eliminated. Consequently, there is neither a uniformly structured address bus nor a similarly constructed data bus. The interface circuits have also been subdivided. Thus, the interface circuit to the first storage unit, being the EEPROM 12, is subdivided into six interface circuits 70, 71, 72, 73, 74, 75. These interface sub-circuits are irregularly distributed between the central processor unit 11 and the EEPROM 12. The interface sub-circuits 70, 72, 74 are present within the central processor unit 11 and the remaining interface circuits 71, 73, 75 are arranged within the EEPROM 12. The positions and the construction of the interface sub-circuits 70 to 75 are irregularly chosen, so that should the structure of one of the interface sub-circuits 70 to 75 be discovered, the position and the function of the other interface sub-circuits cannot yet be deduced. Between the interface sub-circuits 70, 72, 74 inside the central processor unit 11 on the one side and the interface sub-circuits 71, 73, 75 inside the EEPROM 12 on the other side there are provided connection leads as local buses 76, 77 and 78. Address and data leads are distributed in an irregularly scrambled manner within said local buses. This means that parallel leads in the local bus 76 carry irregularly assigned address or data signals of different meaning so, for example different significance of the individual transported bits. Thus, the interface sub-circuit 70 does not exchange closed address signals or data signals with the interface sub-circuit 71, but rather a regularly composed selection from the totality of signals to be transferred between the central processor unit 11 and the EEPROM 12. The same holds for the other local buses 77, 78 between the central processor unit 11 and the EEPROM 12. Moreover, the local buses 76, 77, 78, being shown as single lines in FIG. 2 for the sake of simplicity, may also consist of several connection leads with a different location and routing, so that the individual local bus can no longer be recognized on the basis of its regular routing of a plurality of parallel connection leads.

The other storage units, i.e. the RAM 13 and the ROM 14, are connected to the central processor unit 11 in a similar manner. This is realized via the interface sub-circuits 80 and 82 which are provided within the central processor unit 11 in FIG. 2 and are connected to interface sub-circuits 81, 83 within the RAM 13 via local buses 84, 85. Further interface sub-circuits 90, 92 within the central processor unit 11 are connected to interface sub-circuits 91, 93 in the ROM 14 via local buses 94, 95. In respect of the configuration of the interface sub-circuits 80 to 83, 90 to 93 and the local buses 84, 85, 94, 95 the same holds as described for those connected between the central processor unit 11 and the EEPROM 12.

For further blurring of the structures the interface sub-circuits 70 to 75, 80 to 93, 90 to 93 may have a mutually irregular construction. Moreover, the other circuit elements of the central processor unit 11 and the storage units 12, 13, 14 are also irregularly arranged or internally connected via at least irregularly routed connection leads. A modular structure is thus eliminated as far as possible or at least made irrecognizable. The elimination of a regular, modular structure can then already be achieved in that, for example two neighboring circuit elements having the same appearance no longer succeed one another in the signal flow of the data processing or process parallel bits of a binary signal, but are assigned to completely different functions.

In this sense the interface sub-circuits 70, 72, 74, 80, 82, 90, 92 are connected to one another and to the other circuit elements of the central processor unit 11 via an internal bus 100. The connection leads of said internal bus 100 preferably are also arranged irregularly in respect of location and routing, the assignment of the signals on the individual connection leads of the internal bus 100 preferably also being irregularly scrambled. Regular bus structures are thus also avoided within the central processor unit 11, so that the significance of the individual connection leads is effectively camouflaged.

The steps proposed by the invention in order to make tentative forgery of a microcontroller circuit more difficult can be advantageously combined with other steps serving the same purpose. It is particularly effective to combine the invention with encryption of data signals to be transmitted notably between the central processor unit 11 and the storage units 12, 13, 14. However, encryption of other signals, for example address signals, also forms an advantageous alternative.

What is claimed is:

1. A microcontroller circuit, comprising:
   a central processor unit and at least one storage unit arranged on a semiconductor body, wherein the central processor unit and the at least one storage unit are interconnected and are characterized in that the processor and the at least one storage unit on the semiconductor are arranged in an irregularly scrambled spatial configuration, wherein the configuration of the microcontroller circuit prevents forgery by topography recognition.

2. A microcontroller circuit as claimed in claim 1, characterized in that the positions of the central processor unit and the at least one storage unit on the semiconductor body and/or the location and routing of connection leads connected thereto are irregularly scrambled.

3. A microcontroller circuit as claimed in claim 1, wherein the central processor unit is characterized in that at least a number of the circuit elements included in the central processor unit are irregularly scrambled in respect of position and/or in respect of the location and routing of connection leads connected thereto.

4. A microcontroller circuit as claimed in claim 1, wherein the at least one storage unit is characterized in that for at least a number of the circuit elements included in the storage unit (storage units) the location and routing of the connection leads connected thereto are irregularly scrambled.

5. A microcontroller circuit as claimed in claim 4, characterized in that at least a part of address and/or data leads connected to the at least a number of the circuit elements included in the storage unit (storage units) is arranged so as to be interchanged in respect of location and/or routing.

6. A microcontroller circuit as claimed in claim 5, characterized in that the address and/or data leads are irregularly interchanged.

7. A microcontroller circuit as claimed in claim 1, comprising at least one storage unit and a central processor unit as well as an interface circuit interconnecting said units, characterized in that the interface circuit (circuits) is (are) irregularly subdivided into interface sub-circuits which occupy separate positions on the semiconductor body.

8. A microcontroller circuit as claimed in claim 7, characterized in that the interface sub-circuits are connected to the storage unit (units) and the central processor unit via connection leads which are preferably connected and routed in an irregularly scrambled manner.

9. An electronic circuit comprised on a semiconductor integrated circuit body, said electronic circuit comprising:
   a plurality of functionally distinguishable circuit elements comprising a central processor unit and at least one storage unit, co-operating with each other through interface circuits, at least a subset of said interface circuits being subdivided into interface sub-circuits located at predetermined, physically distinguishable locations on said semiconductor body, said subdivisions into interface sub-circuits being such that pairs of cooperating interface sub-circuits on pairs of functionally distinguishable circuit elements of said plurality of functionally distinguishable circuit elements are irregularly physically scattered on said semiconductor integrated circuit body, wherein the electronic circuit prevents forgery by topography recognition.

10. An electronic circuit as claimed in claim 9, wherein at least one pair of said pairs of cooperating interface sub-circuits exchanges data through a data bus, said data bus being formed by an irregular pattern of at least two electrically conducting connection leads on said semiconductor integrated circuit body, said irregular pattern being such that a routing of one of said at least two electrically conducting connection leads is substantially different from a routing of another one of said at least two electrically conducting connection leads.

11. An electronic circuit as claimed in claim 10, wherein data bits of a word of data to be conveyed on said data bus are assigned to predetermined connections leads of said at least two electrically conducting leads, a number of bits of said word being equal to a number of leads of said at least two electrically conducting leads, said assignment not being trivial.

12. An electronic circuit as claimed in claim 10, wherein said electronic circuit is a microcontroller and said functionally distinguishable circuit elements at least include a central processor circuit and a memory circuit.

* * * * *